United States Patent
Sun et al.

(10) Patent No.: US 11,305,345 B2
(45) Date of Patent: Apr. 19, 2022

(54) METHOD FOR PREPARING NEODYMIUM-IRON-BORON PERMANENT MAGNETIC MATERIAL

(71) Applicants: BAOTOU RESEARCH INSTITUTE OF RARE EARTHS, Baotou (CN); NATIONAL ENGINEERING RESEARCH CENTRE OF RUIKE RARE EARTH METALLURGY AND FUNCTION MATERIALS CO., LTD., Baotou (CN); BAOTOU IRON & STEEL (GROUP) CO., LTD., Baotou (CN); XIAMEN INSTITUTE OF RARE-EARTH MATERIALS, Xiamen (CN); BAOTOU JINSHAN MAGNETIC MATERIAL CO. LTD, Baotou (CN)

(72) Inventors: Liangcheng Sun, Baotou (CN); Zhanfeng Yang, Baotou (CN); Zhihong Zhang, Baotou (CN); Xiaoyu Liu, Baotou (CN); Shufeng Liu, Baotou (CN); Fan Yang, Xiamen (CN); Jixiang Liu, Baotou (CN); Yu Wang, Baotou (CN); Jingya Li, Baotou (CN); Fei Lu, Baotou (CN); Shupu Lou, Baotou (CN); Hui Li, Baotou (CN); Peixin Chen, Baotou (CN); Yang Bai, Baotou (CN); Yu Cheng, Baotou (CN); Feng Wang, Baotou (CN); Tiancang Zheng, Baotou (CN); Feng Xia, Baotou (CN); Caina Sun, Baotou (CN)

(73) Assignees: BAOTOU RESEARCH INSTITUTE OF RARE EARTHS, Baotou (CN); NATIONAL ENGINEERING RESEARCH CENTRE OF RUIKE RARE EARTH METALLURGY AND FUNCTION MATERIALS CO., LTD., Baotou (CN); BAOTOU IRON & STEEL (GROUP) CO., LTD., Baotou (CN); XIAMEN INSTITUTE OF RARE-EARTH MATERIALS, Fujian (CN); BAOTOU JINSHAN MAGNETIC MATERIAL CO. LTD, Baotou (CN)

( * ) Notice: Subject to any disclaimer, the term of this patent is extended or adjusted under 35 U.S.C. 154(b) by 397 days.

(21) Appl. No.: 16/472,034

(22) PCT Filed: Dec. 21, 2017

(86) PCT No.: PCT/CN2017/117641
§ 371 (c)(1),
(2) Date: Jun. 20, 2019

(87) PCT Pub. No.: WO2018/113717
PCT Pub. Date: Jun. 28, 2018

(65) Prior Publication Data
US 2020/0001360 A1 Jan. 2, 2020

(30) Foreign Application Priority Data

Dec. 21, 2016 (CN) .......................... 201611191110.6
Dec. 21, 2016 (CN) .......................... 201611192264.7
(Continued)

(51) Int. Cl.
B22F 1/02 (2006.01)
B22F 1/17 (2022.01)
(Continued)

(52) U.S. Cl.
CPC .................. *B22F 1/17* (2022.01); *B22F 9/04* (2013.01); *H01F 1/0577* (2013.01);
(Continued)

(58) Field of Classification Search
CPC ........ B22F 1/17; B22F 9/04; B22F 2301/355; B22F 2304/10; H01F 1/0577;
(Continued)

(56) References Cited

U.S. PATENT DOCUMENTS

2005/0164035 A1* 7/2005 Lee .................... G11B 5/855
428/823
2010/0224486 A1* 9/2010 Ling .................... C23C 14/546
204/298.11
(Continued)

FOREIGN PATENT DOCUMENTS

CN 102280240 A * 12/2011
CN 102280240 A 12/2011
(Continued)

OTHER PUBLICATIONS

Nakamura et al ("Effects of Hydrogenation-Disproportionation-Desorption-Recombination Processing Parameters on the Particle Size of Ultrafine Jet-Milled Nd—Fe—B Powders", Materials Transactions, vol. 56, No. 1 (2015)). (Year: 2015).*
(Continued)

*Primary Examiner* — Robert S Jones, Jr.
*Assistant Examiner* — Jiangtian Xu
(74) *Attorney, Agent, or Firm* — Osha Bergman Watanabe & Burton LLP

(57) ABSTRACT

A method for preparing a NdFeB permanent magnetic material may include providing a covered NdFeB magnetic powder by depositing heavy rare earth particles or high-melting particles onto a NdFeB magnetic powder by physical vapor deposition; and performing orientation molding and sintering on the covered NdFeB magnetic powder to provide the NdFeB permanent magnetic material.

1 Claim, No Drawings

| (30) | Foreign Application Priority Data | |
|---|---|---|
| Dec. 21, 2016 | (CN) | 201611192277.4 |
| Dec. 21, 2016 | (CN) | 201611192971.6 |
| Dec. 21, 2016 | (CN) | 201611192973.5 |
| Dec. 21, 2016 | (CN) | 201611195651.6 |
| Jul. 27, 2017 | (CN) | 201710624106.2 |
| Jul. 27, 2017 | (CN) | 201710624675.7 |

(51) Int. Cl.
  *B22F 9/04* (2006.01)
  *H01F 1/057* (2006.01)
  *H01F 41/02* (2006.01)

(52) U.S. Cl.
  CPC .... *H01F 41/0266* (2013.01); *B22F 2301/355* (2013.01); *B22F 2304/10* (2013.01)

(58) Field of Classification Search
  CPC . H01F 41/0266; H01F 41/0273; C23C 14/16; C23C 14/165; C23C 14/18; C23C 14/185; C23C 14/223; C23C 14/35; C23C 14/5806; C23C 14/5886; C22C 2202/02
  See application file for complete search history.

(56) References Cited

U.S. PATENT DOCUMENTS

| 2015/0357119 A1* | 12/2015 | Nagata | C22C 38/16 |
| | | | 419/33 |
| 2019/0368029 A1* | 12/2019 | Polcik | C22C 1/0416 |

FOREIGN PATENT DOCUMENTS

| CN | 102347126 A | * | 2/2012 | C22C 38/002 |
|---|---|---|---|---|
| CN | 103456451 A | | 12/2013 | |
| CN | 106783128 A | | 5/2017 | |
| CN | 106783129 A | | 5/2017 | |
| CN | 106783130 A | | 5/2017 | |
| CN | 106847455 A | | 6/2017 | |
| CN | 106847456 A | | 6/2017 | |
| CN | 106881459 A | | 6/2017 | |
| CN | 107424697 A | | 12/2017 | |

OTHER PUBLICATIONS

Heaney ("Vacuum sintering", Sintering of advanced materials, Woodhead Publishing Limited, 2010) (Year: 2010).*
International Search Report issued in International Application No. PCT/CN2017/117641 dated Mar. 23, 2018 (3 pages).
Written Opinion issued in International Application No. PCT/CN2017/117641 dated Mar. 23, 2018 (4 pages).

* cited by examiner

METHOD FOR PREPARING NEODYMIUM-IRON-BORON PERMANENT MAGNETIC MATERIAL

CROSS-REFERENCE TO RELATED APPLICATIONS

This application is a U.S. national stage entry under 35 U.S.C. § 371 of International Application No. PCT/CN2017/117641 filed on Dec. 21, 2017, which claims priority to Chinese Application Nos. 201611192264.7, 201611192971.6, 201611191110.6, 201611192277.4, 201611192973.5, and 201611195651.6, all filed on Dec. 21, 2016, and to Chinese Application Nos. 201710624106.2 and 201710624675.7, both filed on Jul. 27, 2017. The aforementioned applications are herein incorporated by reference in their entireties for all purposes.

TECHNICAL FIELD OF THE DISCLOSURE

This disclosure relates to a method for preparing a rare earth permanent magnetic material, in particular to a neodymium-iron-boron (NdFeB) permanent magnetic material.

BACKGROUND OF THE DISCLOSURE

NdFeB permanent magnetic material receives the most concerns as a rare earth application in China's rare earth industry. With the development of science and technology, high-performance NdFeB permanent magnetic materials are increasingly needed in more areas. It is well known that in order to improve the coercive force and high temperature usability of NdFeB, it is common to add a small amount of heavy rare earth elements (such as Dy, Tb, etc.) or optimize the process to refine grains in the magnet.

The current methods for reducing the usage amount of heavy rare earth mainly comprise a dual-alloy process and a process involving an intergranular diffusion of heavy rare earth element. The dual-alloy process comprises the separate smelting of a main alloy and an auxiliary alloy containing heavy rare earth elements, crushing them into powders, and then mixing the main alloy magnetic powder and the auxiliary alloy powder with a certain ratio, orientation pressing and sintering the mixture. The amount of the heavy rare earth element used in this process is still large. The process which involves an intergranular diffusion of heavy rare earth elements is performed by the following steps: forming a coating layer of heavy rare earth elements on the surface of NdFeB by the means such as smearing, spraying, dipping and coating; and then diffusing the heavy rare earth elements into the magnet through a high temperature intergranular diffusion, so as to improve the coercive force of the magnet and to reduce the usage of heavy rare earths. However, this process is limited to making relative thin magnetic parts (typically, less than 5 mm thick), and the coercive force cannot be significantly improved when a bulk magnet is prepared.

Nowadays, the common method of refining crystal grains of the magnet is to add a trace amount of elements such as W, Mo, V, Ti, Ta, Zr, Nb, Co, Cr, Ga, etc. to the magnet component, so as to suppress the growth of crystal grains in the magnet. These elements may have uneven distribution in the magnet, such as segregation; thus, the effect of suppressing grain growth is limited; and the excessive addition of these elements may have a serious influence on the performance of the magnet.

In the prior art, an NdFeB magnet is usually prepared by coating an NdFeB powder with a physical vapor deposition method. The physical vapor deposition method comprises magnetron sputtering, electron beam evaporation, and vacuum induction evaporation. However, the disadvantage of the magnetron sputtering method is that the utilization rate of the material is less than 50%; while in the electron beam evaporation method, the equipment is expensive, and it requires a high vacuum and a high evaporation temperature; and the vacuum induction evaporation requires a high vacuum, though the utilization rate of the material is close to 99%, furthermore, in this method, the temperature is so low for the high-melting metals (metals with high melting points) that the evaporation rate is small and the thermal efficiency is low.

SUMMARY OF THE DISCLOSURE

The technical problem to be solved by this disclosure is to provide a method for preparing an NdFeB permanent magnetic material, which can uniformly disperse heavy rare earth particles or high-melting particles (particles with high melting points) at grain boundaries in a magnet, leading to an improved coercive force and a reduction in the usage amount of heavy rare earth, resulting in a significant improvement of the coercive force of the NdFeB magnet.

The technical solution is as follows:

A method for preparing a NdFeB permanent magnetic material, comprises:

preparing NdFeB magnetic material, and then depositing heavy rare earth particles or high-melting particles onto the NdFeB magnetic powder by physical vapor deposition;

performing orientation molding, sintering to prepare a NdFeB magnet.

Further, firstly preparing NdFeB coarse powder with a particle size of 10 μm-2 mm, and then refining the coarse powder into fine powder after deposition.

Further, preparing NdFeB magnetic powder from NdFeB magnet, and then performing particles deposition.

Further, mixing ingredients, smelting and strip casting the mixture, depositing heavy rare earth particles or high-melting particles onto the NdFeB sheets in an inert atmosphere by a physical vapor deposition method, and then crushing and milling the NdFeB sheets into powder.

Further, selecting a desired high-melting target (target with high melting points), placing the NdFeB magnetic powder and the high-melting target in a physical vapor deposition device, respectively; turning on the physical vapor deposition device, and depositing the high-melting particles on the dispersed NdFeB magnetic powder by physical vapor deposition.

Further, preparing the NdFeB magnetic powder, selecting a desired heavy rare earth target, placing the NdFeB magnetic powder and the heavy rare earth target in a physical vapor deposition device, respectively; adjusting the parameters so as to uniformly disperse the NdFeB magnetic powder, while heating the NdFeB magnetic powder; turning on the physical vapor deposition device, and depositing the heavy rare earth particles on the dispersed NdFeB magnetic powder by physical vapor deposition.

Further, mixing ingredients according to a formula, smelting and strip casting the mixture; the NdFeB fine powders are obtained after hydrogen crushing, disproportionation reaction, and jet milling of the NdFeB casting sheets; depositing the heavy rare earth element particles and the high-melting element particles on the NdFeB fine powders by the thermal resistance evaporation deposition method; a NdFeB magnet is obtained by orientation compression molding, vacuum sintering, and heat treatment of the obtained NdFeB fine powders.

Further, the heavy rare earth element particles are selected from particles of elements Dy or Tb, and the high-melting element particles are selected from particles of elements W, Mo, V, Ti, Ta, Zr, Nb, Co, Cr or Ga.

Further, in the physical vapor deposition, an inert atmosphere is used, the temperature is 300-500° C., and the deposition rate is 0.01-50 μm/min.

Further, the NdFeB magnetic powder has an average particle diameter $D_{50}$ of 300 nm-20 μm.

Compared with the prior art, the technical effects of this disclosure comprise:

1. In this disclosure, the heavy rare earth particles or the high-melting particles can be uniformly dispersed at the grain boundaries in the magnet, so that the coercive force of the magnet improves, the crystal grains of the magnet refines, and the usage amount of heavy rare earth reduces, with excellent remanence and magnetic energy product. The method for preparing a NdFeB magnet of this disclosure can significantly increase the coercive force of the NdFeB magnet, refine the crystal grain of the magnet, greatly reduce the amount of heavy rare earth element, reduce the manufacturing cost of the NdFeB magnet, and reduce the oxygen content in the magnet.

2. The NdFeB sheet prepared by the method of this disclosure is crushed and powdered, and then sintered to prepare a NdFeB magnet, which can significantly improve the coercive force of the magnet, greatly reduce the usage amount of the heavy rare earth element, reduce the manufacturing cost of the magnet, and lessen the oxidation phenomenon of magnetic powder caused by reprocessing, the process is simple and easy for implement.

3. The coated NdFeB magnetic powder prepared by the physical vapor deposition method of this disclosure is sintered to prepare an NdFeB magnet. In this process, the usage amount of trace elements is small, and the crystal grains in the magnet are small, so that the coercive force of the NdFeB magnet can be significantly improved, while other magnetic properties remain at higher levels, and the usage amount of the heavy rare earth element can be greatly reduced or even to zero, resulting in a decrease of the manufacturing cost of the NdFeB magnet.

4. Thermal resistance evaporation deposition is utilized in this disclosure to coat the NdFeB fine powder which is then sintered to prepare the NdFeB magnet. This can significantly improve the coercive force of the NdFeB magnet, refine crystal grains of the magnet, and reduce the usage amount of the heavy rare earth element and manufacturing cost of the NdFeB magnet. Details are as follows:

(1) In the thermal resistance evaporation deposition process, a large amount of heat generated by the metal instinct resistance with a large current is directly used to melt the raw material, so as to achieve the purpose of evaporation. The advantages of this process are that the evaporation of the alloy material can be performed at a low vacuum degree, and a large amount of vaporized metal particles are instantaneously generated; the material utilization rate reaches 100%; the equipment cost is low; low voltage, high current, high power operation can be realized; there is no heat conduction or heat convection process, so the heat loss is small.

(2) The NdFeB fine powder is coated by thermal resistance evaporation deposition, which is further sintered to obtain an NdFeB magnet. This can significantly increase the coercive force of the magnet, refine the crystal grain of the magnet, and reduce the use amount of the heavy rare earth element and the manufacturing cost of the magnet.

PREFERRED EMBODIMENTS OF THIS DISCLOSURE

The technical solution of this disclosure will be described in details below with reference to example embodiments. However, the example embodiments can be performed in a variety of forms, they should not be construed as being limited to the embodiments set forth herein; rather, these embodiments are provided to make this disclosure more comprehensive and complete, and fully convey the concept of the example embodiments to those skilled in the art.

The invention is applied to preparing NdFeB magnets, NdFeB sheets, NdFeB magnetic powders, and NdFeB fine powders.

Scheme 1:

A method for preparing an NdFeB magnet with a low amount of heavy rare earth, where the NdFeB magnet has a high coercive force, the specific steps are as follows:

Step 1: preparing an NdFeB magnetic powder, and depositing a trace amount of heavy rare earth particles or high-melting particles onto the NdFeB magnetic powder by physical vapor deposition;

Mixing ingredients, smelting, strip casting, crushing and milling the NdFeB sheets into powder, coating the NdFeB powder by depositing heavy rare earth particles, performing orientation molding; performing physical vapor deposition in an inert atmosphere where the temperature is 300-500° C. and the deposition rate is 0.01-50 μm/min.

Step 2: Sintering to prepare an NdFeB magnet.

The heavy rare earth particles or the high-melting particles can be uniformly dispersed at grain boundaries in the magnet, so that the coercive force of the magnet is increased, the crystal grains in the magnet are refined, the amount of heavy rare earth is reduced, and the remanence and magnetic energy product remains excellent.

Routine 1 of the Preparation of an NdFeB Magnet by Sintering

Step 11: mixing ingredients, smelting, strip casting, crushing and milling the NdFeB sheets into powder, so as to prepare NdFeB magnetic powder with a diameter of 1-20 μm;

Step 12: selecting a desired heavy rare earth target, and placing the NdFeB magnetic powder and the heavy rare earth target in a physical vapor deposition device, respectively;

The heavy rare earth target is at least one selected from pure metal, alloy or oxide of Dy, Tb or Dy-Tb.

Step 13: performing physical vapor deposition in an inert atmosphere (argon or helium or vacuum) to deposit heavy rare earth element (Dy or Tb) particles onto the NdFeB magnetic powder;

Evacuating the chamber to a vacuum degree lower than $2.0 \times 10^{-2}$ Pa, charging an inert gas (argon, argon or helium) to 0.2-1.0 Pa; adjusting the parameters to uniformly disperse the NdFeB magnetic powder while heating magnetic powder to a temperature of 300-500° C.; depositing target particles onto the dispersed NdFeB magnetic powder with a particle deposition rate of 0.01-50 μm/min.

The physical vapor deposition includes magnetron sputtering deposition, ion plating deposition, and evaporation source deposition.

Step 14: terminating the physical vapor deposition, and taking out the NdFeB magnetic powder after its temperature decreases to room temperature.

Step 15: performing orientation compression molding, sintering in the vacuum and annealing treatment on the obtained magnetic powder, so as to obtain a final NdFeB magnet.

Routine 2 of the Preparation of an NdFeB Magnet by Sintering

Step 21: mixing ingredients, smelting, strip casting, crushing and milling the NdFeB sheets into powder, so as to prepare NdFeB magnetic powder with a diameter of 1-20 μm;

Step 22: selecting a desired high-melting target material, and placing the NdFeB magnetic powder and the high-melting target material in a physical vapor deposition device, respectively;

The high-melting target material is at least one selected from pure metal, alloy or oxide of elements, such as, W, Mo, V, Ti, Ta, Zr, Nb, Co, Cr, Ga.

Step 23: depositing the high-melting element (W, Mo, V, Ti, Ta, Zr, Nb, Co, Cr or Ga) particles onto the NdFeB magnetic powder in an inert atmosphere;

Evacuating the chamber to a vacuum degree lower than $2.0 \times 10^{-2}$ Pa, charging an inert gas (argon, helium or vacuum) to 0.2-1.0 Pa; uniformly dispersing the NdFeB magnetic powder while heating magnetic powder with a temperature of 300-500° C.; depositing target particles onto the dispersed NdFeB magnetic powder with a particle deposition rate of 0.01-50 μm/min.

The physical vapor deposition comprises magnetron sputtering deposition, ion plating deposition, and evaporation source deposition.

Step 24: terminating the physical vapor deposition, and taking out the NdFeB magnetic powder after its temperature decreases to room temperature.

Step 25: performing orientation compression molding, sintering in the vacuum and annealing treatment on the obtained magnetic powder, so as to obtain a final NdFeB magnet.

Example 1

(1) Ingredients-mixing, smelting, strip casting, disc crushing and ball milling were performed, so as to obtain magnetic powder of NdFeB alloy with an average particle size of 3.5 μm;

(2) Physical vapor deposition was carried out on the magnetic powder obtained in the step (1);

Dy metal target material was selected, the chamber was evacuated to a vacuum degree of $2.0 \times 10^{-2}$ Pa, argon was charged to 0.2 Pa; the magnetic powder was heated to 380° C., magnetron sputtering was carried out with the sputtering power adjusted to get Dy particle deposition rate of 0.01 μm/min, and the magnetic powder was taken out after its temperature decreased to room temperature;

(3) Orientation molding, sintering and heat treatment were performed on the magnetic powder obtained in the step (2), so as to obtain a final NdFeB magnet.

The magnetic energy product and the coercive force of the magnet prepared in this example were tested with a magnetic property measuring instruments, and compared with the magnet prepared by the conventional method. The results are shown in Table 1.

TABLE 1

| Samples | Remanence/ kGs | Intrinsic coercive force/ kOe | Maximum magnetic energy product/ MGOe |
|---|---|---|---|
| NdFeB | 12.62 | 18.39 | 37.51 |
| NdFeB—Dy | 12.55 | 22.83 | 37.80 |

Example 2

(1) Ingredients-mixing, smelting, strip casting, hydrogen crushing and jet milling were performed, so as to obtain magnetic powder of NdFeB alloy with an average particle size of 4.1 μm;

(2) Physical vapor deposition was carried out on the magnetic powder obtained in the step (1);

Tb metal target material was selected, the chamber was evacuated to a vacuum degree of $5.0 \times 10^{-3}$ Pa, helium was charged till the vacuum degree reached 0.5 Pa; the magnetic powder was heated to 420° C., ion plating (the atoms from the target material are mostly in an ion state with a higher energy, leading to a better combination with the surface of the NdFeB magnetic powder) was performed. The current of the argon source was adjusted so that the deposition rate of the Tb particles was 50 μm/min, and the NdFeB magnetic powder was taken out after its temperature decreased to room temperature;

(3) Orientation molding, sintering and heat treatment were performed on the magnetic powder obtained in the step (2), so as to obtain a final NdFeB magnet.

The magnetic energy product and the coercive force of the magnet prepared in this example were tested with a magnetic property measuring instruments, and compared with the magnet prepared by the conventional method. The results are shown in Table 2.

TABLE 2

| Samples | Remanence/ kGs | Intrinsic coercive force/ kOe | Maximum magnetic energy product/ MGOe |
|---|---|---|---|
| NdFeB | 13.48 | 19.36 | 42.97 |
| NdFeB—Tb | 13.13 | 28.45 | 41.62 |

Example 3

(1) Ingredients-mixing, smelting, strip casting, hydrogen crushing and jet milling were performed, so as to obtain magnetic powder of NdFeB alloy with an average particle size of 3.7 μm;

(2) Physical vapor deposition was performed on the magnetic powder obtained in the step (1);

CoZr metal target material was selected, the chamber was evacuated to a vacuum degree of $9.0 \times 10^{-4}$ Pa, the magnetic powder was heated to 300° C., vapor deposition was carried out with the heating source power of the evaporation boat adjusted to get CoZr atoms vaporized and evaporated at a deposition rate of 3 μm/min, and the NdFeB magnetic powder was taken out after its temperature decreased to room temperature;

(3) Orientation molding, sintering and heat treatment were performed on the magnetic powder obtained in the step (2), so as to obtain a final NdFeB magnet.

The magnetic energy product and the coercive force of the magnet prepared in this example were tested with a magnetic property measuring instruments, and compared with the magnet prepared by the conventional method. The results are shown in Table 3.

TABLE 3

| Samples | Remanence/ kGs | Intrinsic coercive force/ kOe | Maximum magnetic energy product/ MGOe |
|---|---|---|---|
| NdFeB | 13.18 | 19.80 | 41.75 |
| NdFeB—CoZr | 12.97 | 22.38 | 40.70 |

Example 4

(1) Ingredients-mixing, smelting, strip casting, hydrogen crushing and jet milling were performed, so as to obtain magnetic powder of NdFeB alloy with an average particle size of 4.3 μm;

(2) Physical vapor deposition was performed on the magnetic powder obtained in the step (1);

$Dy_2O_3$ target material and Mo target material were selected, the chamber was evacuated to a vacuum degree of $3.0 \times 10^{-2}$ Pa, argon was charged till the vacuum degree reached 0.3 Pa, the magnetic powder was heated to 500° C., magnetron sputtering was simultaneously performed on both kinds of targets with the sputtering power adjusted to get the particle deposition rate of 0.2 μm/min, and the NdFeB magnetic powder was taken out after its temperature decreased to room temperature;

(3) Orientation molding, sintering and heat treatment were performed on the magnetic powder obtained in the step (2), so as to obtain a final NdFeB magnet.

The magnetic energy product and the coercive force of the magnet prepared in this example were tested with a magnetic property measuring instruments, and compared with the magnet prepared by the conventional method. The results are shown in Table 4.

TABLE 4

| Samples | Remanence/ kGs | Intrinsic coercive force/ kOe | Maximum magnetic energy product/ MGOe |
|---|---|---|---|
| NdFeB | 13.32 | 19.43 | 42.13 |
| NdFeBDyMo | 13.18 | 25.59 | 41.65 |

Scheme 2:

A method for preparing an NdFeB magnet with a low amount of heavy rare earth and high coercive force, which can uniformly disperse heavy rare earth particles or high-melting particles at grain boundaries in a magnet, leading to an improved coercive force, refined crystal grains in the magnet, and a reduction in the amount of heavy rare earth, with excellent remanence and magnetic energy product.

The specific steps are as follows:

Step 1: preparing an NdFeB coarse powder, and depositing a trace amount of heavy rare earth particles or high-melting particles onto the NdFeB coarse powder by physical vapor deposition;

Mixing ingredients, smelting, strip casting, coarse crushing the NdFeB sheets into NdFeB coarse powder; during the physical vapor deposition process, an inert atmosphere (argon, helium or vacuum) is utilized, the temperature is 300-500° C., and the deposition rate is 0.01-50 μm/min.

Step 2: performing fine powder milling, orientation molding, and sintering to prepare an NdFeB magnet.

Routine 1: Deposition of Heavy Rare Earth Particles

Step 11: mixing ingredients, smelting, strip casting, coarse crushing to prepare NdFeB coarse powder;

The NdFeB coarse powder has a particle size of 10 μm-2 mm, and the coarse crushing is mechanical crushing or hydrogen crushing.

Step 12: selecting a desired heavy rare earth target material, and placing the NdFeB coarse powder and the heavy rare earth target material in a physical vapor deposition device, respectively.

The heavy rare earth target material is selected from pure metal of Dy, Tb, or alloy of Dy-Tb, or oxides of Dy, Tb. The physical vapor deposition method is selected from magnetron sputtering deposition, ion plating deposition or evaporation source deposition.

Step 13: evacuating the chamber to a degree of vacuum lower than $2.0 \times 10^{-2}$ Pa, charging argon to 0.2-1.0 Pa;

Step 14: adjusting the parameters to uniformly disperse the NdFeB coarse powder while heating the magnetic powder to 300-500° C.;

Step 15: turning on the physical vapor deposition device to deposit the particles of the target onto the dispersed NdFeB coarse powder with a particle deposition rate of 0.01-50 μm/min;

Step 16: terminating the physical vapor deposition, and taking out the coarse powder after its temperature decreases to room temperature.

Step 17: performing fine powder milling, orientation compression molding, sintering in the vacuum, and annealing treatment to obtain a final NdFeB magnet.

Routine 2: Deposition of High-Melting Particles

Step 21: mixing ingredients, smelting, strip casting, coarse crushing to prepare NdFeB coarse powder;

The coarse NdFeB powder has a particle size of 10 μm-2 mm, and the coarse crushing is mechanical crushing or hydrogen crushing.

Step 22: selecting a desired high-melting target material, and placing the NdFeB coarse powder and the high-melting target material in a physical vapor deposition device, respectively;

Selecting at least one pure metal, alloy or oxide from the following as the high-melting target material: W, Mo, V, Ti, Ta, Zr, Nb, Co, Cr, Ga and the like. Selecting from the following as physical vapor deposition: magnetron sputtering deposition, ion plating deposition or evaporation source deposition.

Step 23: evacuating the chamber to a degree of vacuum lower than $2.0 \times 10^{-2}$ Pa, charging argon to 0.2-1.0 Pa;

Step 24: adjusting the parameters to uniformly disperse the NdFeB coarse powder while heating the magnetic powder to 300-500° C.;

Step 25: turning on the physical vapor deposition device to deposit the particles of the target onto the dispersed NdFeB coarse powder;

The particle deposition rate is 0.01-50 μm/min;

Step 26: terminating the physical vapor deposition, and taking out the NdFeB coarse powder after its temperature decreases to room temperature.

Step 27: performing fine powder milling, orientation compression molding, sintering in the vacuum, and annealing treatment on the obtained NdFeB coarse powder to obtain a final NdFeB magnet.

Example 5

(1) Ingredients-mixing, smelting, strip casting, coarse crushing with disc grinding were carried out;

(2) Physical vapor deposition was performed on the obtained NdFeB coarse powder:

Dy metal target material was selected, the chamber was evacuated to a vacuum degree of $2.0 \times 10^{-2}$ Pa, argon was charged to 0.2 Pa, magnetron sputtering was carried out with the sputtering power adjusted to get Dy particle deposition rate of 0.01 μm/min;

(3) Ball milling, orientation molding, sintering and heat treatment were performed on the obtained NdFeB coarse powder, so as to obtain a final NdFeB magnet.

The magnetic energy product and the coercive force of the magnet prepared in this example were tested with a magnetic property measuring instruments, and compared with the magnet prepared by the conventional method. The results are shown in Table 5.

TABLE 5

| Samples | Remanence/ kGs | Intrinsic coercive force/ kOe | Maximum magnetic energy product/ MGOe |
|---|---|---|---|
| NdFeB | 12.62 | 18.39 | 37.51 |
| NdFeB—Dy | 12.55 | 22.83 | 37.80 |

Example 6

(1) Ingredients-mixing, smelting, strip casting, hydrogen crushing were carried out;

(2) Physical vapor deposition was performed on the obtained NdFeB coarse powder:

Tb metal target material was selected, the chamber was evacuated to a vacuum degree of $5.0 \times 10^{-3}$ Pa, argon was charged to 0.5 Pa The NdFeB coarse powder was heated to 300° C., ion plating was carried out with the current of the argon source adjusted, so that the deposition rate of the Tb particles is 50 μm/min;

(3) Jet milling, orientation molding, sintering and heat treatment were performed on the obtained NdFeB coarse powder, so as to obtain a final NdFeB magnet.

The magnetic energy product and the coercive force of the magnet prepared in this example were tested with a magnetic property measuring instruments, and compared with the magnet prepared by the conventional method. The results are shown in Table 6.

TABLE 6

| Samples | Remanence/ kGs | Intrinsic coercive force/ kOe | Maximum magnetic energy product/ MGOe |
|---|---|---|---|
| NdFeB | 13.48 | 19.36 | 42.97 |
| NdFeB—Tb | 13.13 | 28.45 | 41.62 |

Example 7

(1) Ingredients-mixing, smelting, strip casting, hydrogen crushing were carried out;

(2) Physical vapor deposition was performed on the obtained NdFeB coarse powder:

CoZr metal target material was selected, the chamber was evacuated to a vacuum degree of $9.0 \times 10^{-4}$ Pa, the NdFeB coarse powder was heated to 500° C., The vapor deposition was carried out with the heating source power of the evaporation boat adjusted to get CoZr atoms vaporized and evaporated at a deposition rate of 3 μm/min;

(3) Jet milling, orientation molding, sintering and heat treatment were performed on the obtained NdFeB coarse powder, so as to obtain a final NdFeB magnet.

The magnetic energy product and the coercive force of the magnet prepared in this example were tested with a magnetic property measuring instruments, and compared with the magnet prepared by the conventional method. The results are shown in Table 7.

TABLE 7

| Samples | Remanence/ kGs | Intrinsic coercive force/ kOe | Maximum magnetic energy product/ MGOe |
|---|---|---|---|
| NdFeB | 13.18 | 19.80 | 41.75 |
| NdFeB—CoZr | 12.97 | 22.38 | 40.70 |

Example 8

(1) Ingredients-mixing, smelting, strip casting, hydrogen crushing were carried out;

(2) Physical vapor deposition was performed on the obtained NdFeB coarse powder:

$Dy_2O_3$ target material, Mo target material were selected, the chamber was evacuated to a vacuum degree of $3.0 \times 10^{-2}$ Pa, argon was charged to 0.3 Pa, the NdFeB coarse powder was heated to 420° C., magnetron sputtering was simultaneously performed on both kinds of targets with the sputtering power adjusted to get the particle deposition rate of 0.2 μm/min;

(3) Jet milling, orientation molding, sintering and heat treatment were performed on the obtained NdFeB coarse powder, so as to obtain a final NdFeB magnet.

The magnetic energy product and the coercive force of the magnet prepared in this example were tested with a magnetic property measuring instruments, and compared with the magnet prepared by the conventional method. The results are shown in Table 8.

TABLE 8

| Samples | Remanence/ kGs | Intrinsic coercive force/ kOe | Maximum magnetic energy product/ MGOe |
|---|---|---|---|
| NdFeB | 13.32 | 19.43 | 42.13 |
| NdFeB—DyMo | 13.18 | 25.59 | 41.65 |

Scheme 3:

A method for preparing an NdFeB magnet with a low amount of heavy rare earth but high coercive force, the specific steps are as follows:

Step 1: mixing ingredients, smelting, strip casting;

Step 2: carrying out physical vapor deposition method in an inert atmosphere to deposit the target particles (a trace amount of heavy rare earth particles or high-melting particles) onto the NdFeB sheets;

The target particles of the physical vapor deposition are selected from the group consisting of particles of heavy rare earth elements Dy or Tb, or high-melting particles of one or more elements of W, Mo, V, Ti, Ta, Zr, Nb, Co, Cr, Ga. The inert atmosphere is argon or helium or vacuum.

Step 3: further, the NdFeB magnet is prepared by crushing and sintering.

Routine 1: Deposition of a Trace Amount of Heavy Rare Earth Particles

Step 11: mixing ingredients, smelting, strip casting;

Step 12: selecting a desired heavy rare earth target material;

Step 13: placing the NdFeB alloy sheets and the heavy rare earth target material in a physical vapor deposition device, respectively;

The heavy rare earth target material is at least one selected from the group of pure metal, alloy or oxide of Dy, Tb or Dy-Tb.

Step 14: evacuating the chamber to a vacuum degree lower than $2.0 \times 10^{-2}$ Pa, charging argon to 0.2-1.0 Pa;

Step 15: adjusting the parameters, heating the NdFeB sheets, where the heating temperature is 300-500° C.;

Step 16: turning on the physical vapor deposition device to deposit the particles of the target onto the NdFeB sheets by the physical vapor deposition;

The physical vapor deposition includes magnetron sputtering deposition, ion plating deposition, and evaporation source deposition. The particle deposition rate is 0.01-50 μm/min.

Step 17: terminating the physical vapor deposition, and taking out the NdFeB sheets after their temperature decreases to room temperature;

Step 18: crushing the obtained NdFeB sheets into powder, and performing orientation compression molding, sintering in the vacuum and annealing treatment, so as to obtain a final NdFeB magnet.

Routine 2: Deposition of High-Melting Particles

Step 21: mixing ingredients, smelting, strip casting;

Step 22: selecting a desired high-melting target material;

Step 23: placing the NdFeB alloy sheets and the high-melting target material in a physical vapor deposition device, respectively;

The high-melting target material is at least one selected from the group of pure metal, alloy or oxide of elements W, Mo, V, Ti, Ta, Zr, Nb, Co, Cr, Ga and the like.

Step 24: evacuating the chamber to a degree of vacuum lower than $2.0 \times 10^{-2}$ Pa, charging argon to 0.2-1.0 Pa;

Step 25: adjusting the parameters to heat the NdFeB sheets, where the heating temperature is 300-500° C.;

Step 26: turning on the physical vapor deposition device to deposit the particles of the target onto the NdFeB sheets by the physical vapor deposition;

The physical vapor deposition includes magnetron sputtering deposition, ion plating deposition, and evaporation source deposition. The particle deposition rate is 0.01-50 μm/min.

Step 27: terminating the physical vapor deposition, and taking out the NdFeB sheets after their temperature decreases to room temperature;

Step 28: crushing the prepared NdFeB sheets into powder, and performing orientation compression molding, sintering in the vacuum and annealing treatment, so as to obtain a final NdFeB magnet.

Example 9

(1) Ingredients-mixing, smelting, strip casting were carried out to prepare NdFeB sheets;

(2) Physical vapor deposition was performed on the obtained NdFeB sheets:

Dy metal target material was selected, the chamber was evacuated to a vacuum degree of $2.0 \times 10^{-2}$ Pa, argon was charged to 0.2 Pa, magnetron sputtering was carried out with the sputtering power adjusted to get Dy particle deposition rate of 0.01 μm/min;

(3) Disc crushing, ball milling, orientation molding, sintering and heat treatment were performed on the obtained NdFeB sheets, so as to obtain a final NdFeB magnet.

The magnetic energy product and the coercive force of the magnet prepared in this example were tested with a magnetic property measuring instruments, and compared with the magnet prepared by the conventional method. The results are shown in Table 9.

TABLE 9

| Samples | Remanence/ kGs | Intrinsic coercive force/ kOe | Maximum magnetic energy product/ MGOe |
|---------|----------------|------------------------------|----------------------------------------|
| NdFeB   | 12.62          | 18.39                        | 37.51                                  |
| NdFeB—Dy | 12.55         | 22.83                        | 37.80                                  |

Example 10

(1) Ingredients-mixing, smelting, strip casting were carried out to prepare NdFeB sheets;

(2) Physical vapor deposition was performed on the obtained NdFeB sheets:

Tb metal target material was selected, the chamber was evacuated to a vacuum degree of $5.0 \times 10^{-3}$ Pa, helium was charged to 0.5 Pa, the NdFeB sheets were heated to 300° C., ion plating was carried out with the current of the argon source adjusted, so that the deposition rate of the Tb particles is 50 μm/min;

(3) Hydrogen crushing, jet milling, orientation molding, sintering and heat treatment were performed on the obtained NdFeB sheets, so as to obtain a final NdFeB magnet.

The magnetic energy product and the coercive force of the magnet prepared in this example were tested with a magnetic property measuring instruments, and compared with the magnet prepared by the conventional method. The results are shown in Table 10.

TABLE 10

| Samples | Remanence/ kGs | Intrinsic coercive force/ kOe | Maximum magnetic energy product/ MGOe |
|---------|----------------|------------------------------|----------------------------------------|
| NdFeB   | 13.48          | 19.36                        | 42.97                                  |
| NdFeB—Tb | 13.13         | 28.45                        | 41.62                                  |

Example 11

(1) Ingredients-mixing, smelting, strip casting were carried out to prepare NdFeB sheets;
(2) Physical vapor deposition was performed on the obtained NdFeB sheets:

CoZr metal target material was selected, the chamber was evacuated to a vacuum degree of $9.0 \times 10^{-4}$ Pa, the NdFeB sheets were heated to 500° C.

The vapor deposition was carried out with the heating source power of the evaporation boat adjusted to get CoZr atoms vaporized and evaporated at a deposition rate of 3 μm/min.

(3) Hydrogen crushing, jet milling, orientation molding, sintering and heat treatment were performed on the obtained NdFeB sheets, so as to obtain a final NdFeB magnet.

The magnetic energy product and the coercive force of the magnet prepared in this example were tested with a magnetic property measuring instruments, and compared with the magnet prepared by the conventional method. The results are shown in Table 11.

TABLE 11

| Samples | Remanence/ kGs | Intrinsic coercive force/ kOe | Maximum magnetic energy product/ MGOe |
|---|---|---|---|
| NdFeB | 13.18 | 19.80 | 41.75 |
| NdFeB—CoZr | 12.97 | 22.38 | 40.70 |

Example 12

(1) Ingredients-mixing, smelting, strip casting were carried out to prepare NdFeB sheets;
(2) Physical vapor deposition was performed on the obtained NdFeB sheets:

$Dy_2O_3$ target material, Mo target material were selected, the chamber was evacuated to a vacuum degree of $3.0 \times 10^{-2}$ Pa, argon was charged to 0.3 Pa, the NdFeB sheets were heated to 420° C., magnetron sputtering was simultaneously performed on both kinds of targets with the sputtering power adjusted to get the particle deposition rate of 0.2 μm/min;

(3) Hydrogen crushing, jet milling, orientation molding, sintering and heat treatment were performed on the obtained NdFeB sheets, so as to obtain a final NdFeB magnet.

The magnetic energy product and the coercive force of the magnet prepared in this example were tested with a magnetic property measuring instruments, and compared with the magnet prepared by the conventional method. The results are shown in Table 12.

TABLE 12

| Samples | Remanence/ kGs | Intrinsic coercive force/ kOe | Maximum magnetic energy product/ MGOe |
|---|---|---|---|
| NdFeB | 13.32 | 19.43 | 42.13 |
| NdFeB—DyMo | 13.18 | 25.59 | 41.65 |

Scheme 4:

A method for preparing a NdFeB sheets, comprising the specific steps as follows:

Step 1: mixing the ingredients according to the formula, smelting and strip casting the mixture;

Step 2: carrying out physical vapor deposition method to deposit the target particles onto the NdFeB sheets.

The physical vapor deposition includes magnetron sputtering deposition, ion plating deposition, and evaporation source deposition. During the physical vapor deposition process, an inert atmosphere is utilized, the temperature is 300-500° C., and the deposition rate is 0.01-50 μm/min. The inert atmosphere is argon or helium or vacuum.

Routine 1:

Step 11: mixing the ingredients according to the formula, smelting and strip casting the mixture;

Step 12: placing the NdFeB sheets and the target material of heavy rare earth in a physical vapor deposition device, respectively;

The target material of heavy rare earth is at least one pure metal, alloy or oxide of Dy, Tb or Dy-Tb.

Step 13: evacuating the chamber to a degree of vacuum lower than $2.0 \times 10^{-2}$ Pa, charging argon to 0.2-1.0 Pa;

Step 14: heating the NdFeB sheets with a heating temperature of 300-500° C.

Step 15: turning on the physical vapor deposition device to deposit the heavy rare earth particles onto the NdFeB sheets by the physical vapor deposition;

The physical vapor deposition includes magnetron sputtering deposition, ion plating deposition, and evaporation source deposition. The heavy rare earth particle deposition rate is 0.01-50 μm/min.

Step 16: terminating the physical vapor deposition, and taking out the NdFeB sheets after their temperature decreases to room temperature.

Routine 2:

Step 21: mixing the ingredients according to the formula, smelting and strip casting the mixture;

Step 22: placing the NdFeB sheets and the high-melting target material in a physical vapor deposition device, respectively;

The high-melting target material is at least one pure metal, alloy or oxide of elements W, Mo, V, Ti, Ta, Zr, Nb, Co, Cr, Ga and the like.

Step 23: evacuating the chamber to a degree of vacuum lower than $2.0 \times 10^{-2}$ Pa, charging argon to 0.2-1.0 Pa;

Step 24: heating the NdFeB sheets with a heating temperature of 300-500° C.

Step 25: turning on the physical vapor deposition device to deposit the high-melting particles onto the NdFeB sheets by the physical vapor deposition;

The physical vapor deposition includes magnetron sputtering deposition, ion plating deposition, and evaporation source deposition. The high-melting particles deposition rate is 0.01-50 μm/min.

Step 26: terminating the physical vapor deposition, and taking out the NdFeB sheets after their temperature decreases to room temperature.

The physical vapor deposition of the NdFeB sheets can be carried out simultaneously using Schemes 1 and 2.

Example 13

(1) Ingredients-mixing, smelting, strip casting were carried out to prepare NdFeB sheets;
(2) Physical vapor deposition was performed on the obtained NdFeB sheets:

Dy metal target material was selected, the chamber was evacuated to a vacuum degree of $2.0 \times 10^{-2}$ Pa, argon was charged to 0.2 Pa, magnetron sputtering was carried out with the sputtering power adjusted to get Dy particle deposition rate of 0.01 μm/min;

(3) Disc crushing, ball milling, orientation molding, sintering and heat treatment were performed on the obtained NdFeB sheets, so as to obtain a final NdFeB magnet.

The magnetic energy product and the coercive force of the magnet prepared in this example were tested with a magnetic property measuring instruments, and compared with the magnet prepared by the conventional method. The results are shown in Table 13.

TABLE 13

| Samples | Remanence/ kGs | Intrinsic coercive force/ kOe | Maximum magnetic energy product/ MGOe |
|---|---|---|---|
| NdFeB | 12.62 | 18.39 | 37.51 |
| NdFeB—Dy | 12.55 | 22.83 | 37.80 |

Example 14

(1) Ingredients-mixing, smelting, strip casting were carried out to prepare NdFeB sheets;

(2) Physical vapor deposition was performed on the obtained NdFeB sheets:

Tb metal target material was selected, the chamber was evacuated to a vacuum degree of $5.0 \times 10^{-3}$ Pa, helium was charged to 0.5 Pa, the NdFeB sheets were heated to 300° C., ion plating was carried out with the current of the argon source adjusted, so that the deposition rate of the Tb particles is 50 μm/min;

(3) Hydrogen crushing, jet milling, orientation molding, sintering and heat treatment were performed on the obtained NdFeB sheets, so as to obtain a final NdFeB magnet.

The magnetic energy product and the coercive force of the magnet prepared in this example were tested with a magnetic property measuring instruments, and compared with the magnet prepared by the conventional method. The results are shown in Table 14.

TABLE 14

| Samples | Remanence/ kGs | Intrinsic coercive force/ kOe | Maximum magnetic energy product/ MGOe |
|---|---|---|---|
| NdFeB | 13.48 | 19.36 | 42.97 |
| NdFeB—Tb | 13.13 | 28.45 | 41.62 |

Example 15

(1) Ingredients-mixing, smelting, strip casting were carried out to prepare NdFeB sheets;

(2) Physical vapor deposition was performed on the obtained NdFeB sheets:

CoZr metal target material was selected, the chamber was evacuated to a vacuum degree of $9.0 \times 10^{-4}$ Pa, the NdFeB sheets were heated to 500° C.

The vapor deposition was carried out with the heating source power of the evaporation boat adjusted to get CoZr atoms vaporized and evaporated at a deposition rate of 3 μm/min.

(3) Hydrogen crushing, jet milling, orientation molding, sintering and heat treatment were performed on the obtained NdFeB sheets, so as to obtain a final NdFeB magnet.

The magnetic energy product and the coercive force of the magnet prepared in this example were tested with a magnetic property measuring instruments, and compared with the magnet prepared by the conventional method. The results are shown in Table 15.

TABLE 15

| Samples | Remanence/ kGs | Intrinsic coercive force/ kOe | Maximum magnetic energy product/ MGOe |
|---|---|---|---|
| NdFeB | 13.18 | 19.80 | 41.75 |
| NdFeB—CoZr | 12.97 | 22.38 | 41.70 |

Example 16

(1) Ingredients-mixing, smelting, strip casting were carried out to prepare NdFeB sheets;

(2) Physical vapor deposition was performed on the obtained NdFeB sheets:

$Dy_2O_3$ target material and Mo target material were selected, the chamber was evacuated to a vacuum degree of $3.0 \times 10^{-2}$ Pa, argon was charged to 0.3 Pa.

The NdFeB sheets were heated to 420° C., magnetron sputtering was simultaneously performed on both kinds of targets with the sputtering power adjusted to get the particle deposition rate of 0.2 μm/min;

(3) Hydrogen crushing, jet milling, orientation molding, sintering and heat treatment were performed on the obtained NdFeB sheets, so as to obtain a final NdFeB magnet.

The magnetic energy product and the coercive force of the magnet prepared in this example were tested with a magnetic property measuring instruments, and compared with the magnet prepared by the conventional method. The results are shown in Table 16.

TABLE 16

| Samples | Remanence/ kGs | Intrinsic coercive force/ kOe | Maximum magnetic energy product/ MGOe |
|---|---|---|---|
| NdFeB | 13.32 | 19.43 | 42.13 |
| NdFeB-deposition | 13.18 | 25.59 | 41.65 |

Scheme 5:

A method for preparing NdFeB magnetic powder, comprising the specific steps as follows:

Step 1: preparing NdFeB magnetic powder of 1 μm-2 mm;

After smelting and casting, the NdFeB magnet is mechanically crushed, or hydrogen crushed, or crushed in an air jet mill to prepare NdFeB magnetic powder.

Step 2: selecting a desired high-melting target material, placing the NdFeB magnetic powder and the high-melting target material in a physical vapor deposition device, respectively;

The high-melting target material is at least one pure metal, alloy or oxide of W, Mo, V, Ti, Ta, Zr, Nb, Co, Cr, Ga.

Step 3: evacuating the chamber to a degree of vacuum lower than $2.0 \times 10^{-2}$ Pa, charging argon to 0.2-1.0 Pa;

Step 4: adjusting the parameters to uniformly disperse the NdFeB magnetic powder while heating the NdFeB magnetic powder, where the heating temperature is 300-500° C.;

Step 5: turning on the physical vapor deposition device to deposit the high-melting particles onto the dispersed NdFeB magnetic powder by the physical vapor deposition;

The physical vapor deposition includes magnetron sputtering deposition, ion plating deposition, and evaporation source deposition. The deposition rate of the high-melting particles is 0.01-50 μm/min. The high-melting particles are particles of elements W, Mo, V, Ti, Ta, Zr, Nb, Co, Cr or Ga.

Step 6: terminating the physical vapor deposition, and taking out the NdFeB magnetic powder after its temperature decreases to room temperature;

Example 17

(1) Ingredients-mixing, smelting, strip casting, disc crushing and ball milling were performed, so as to obtain a NdFeB magnetic powder with an average particle size of 3.5 μm;

(2) Physical vapor deposition was carried out to cover the obtained magnetic powder.

Ti metal target material was selected, the chamber was evacuated to a vacuum degree of $2.0 \times 10^{-2}$ Pa, argon was charged to 0.2 Pa; the magnetic powder was heated to 380° C., magnetron sputtering was carried out with the sputtering power adjusted to get Ti particle deposition rate of 0.01 μm/min, and the covered NdFeB magnetic powder was taken out after its temperature decreases to room temperature.

Orientation molding, sintering and heat treatment were performed on the obtained magnetic powder, so as to obtain a final NdFeB magnet. The magnetic energy product and the coercive force of the magnet prepared in this example were tested with a magnetic property measuring instruments, and compared with the magnet prepared with the same addition amount of Ti by the conventional method. The results are shown in Table 17.

TABLE 17

| Samples | Remanence/ kGs | Intrinsic coercive force/ kOe | Maximum magnetic energy product/ MGOe |
|---|---|---|---|
| Conventional method | 12.62 | 18.39 | 37.51 |
| Covering method | 12.55 | 20.83 | 38.40 |

Example 18

(1) Ingredients-mixing, smelting, strip casting, hydrogen crushing and jet milling were performed, so as to obtain NdFeB magnetic powder with an average particle size of 4.1 μm;

(2) Physical vapor deposition was carried out to cover the obtained magnetic powder.

Mo metal target material was selected, the chamber was evacuated to a vacuum degree of $5.0 \times 10^{-3}$ Pa, argon was charged to 0.5 Pa; the magnetic powder was heated to 420° C., magnetron sputtering was carried out with the sputtering power adjusted to get Mo particle deposition rate of 50 μm/min, and the covered NdFeB magnetic powder was taken out after its temperature decreases to room temperature.

Orientation molding, sintering and heat treatment were performed on the obtained magnetic powder, so as to obtain a final NdFeB magnet. The magnetic energy product and the coercive force of the magnet prepared in this example were tested with a magnetic property measuring instruments, and compared with the magnet prepared with the same addition amount of Mo by the conventional method. The results are shown in Table 18.

TABLE 18

| Samples | Remanence/ kGs | Intrinsic coercive force/ kOe | Maximum magnetic energy product/ MGOe |
|---|---|---|---|
| Conventional method | 13.48 | 19.36 | 42.97 |
| Covering method | 13.13 | 22.45 | 43.62 |

Example 19

(1) Ingredients-mixing, smelting, strip casting, hydrogen crushing were performed, so as to obtain NdFeB magnetic powder;

(2) Physical vapor deposition was carried out to cover the obtained magnetic powder;

CoZr metal target material was selected, the chamber was evacuated to a vacuum degree of $9.0 \times 10^{-4}$ Pa, the magnetic powder was heated to 300° C., the vapor deposition was carried out with the heating source power of the evaporation boat adjusted to get CoZr atoms vaporized and evaporated at a deposition rate of 3 μm/min, and the covered NdFeB magnetic powder was taken out after its temperature decreases to room temperature.

(3) Jet milling was performed on the obtained magnetic powder, so as to prepare NdFeB magnetic powder with an average particle size of 3.7 μm.

Orientation molding, sintering and heat treatment were performed on the prepared NdFeB magnetic powder, so as to obtain a final NdFeB magnet. The magnetic energy product and the coercive force of the magnet prepared in this example were tested with a magnetic property measuring instruments, and compared with the magnet prepared with the same addition amount of CoZr by the conventional method. The results are shown in Table 19.

TABLE 19

| Samples | Remanence/ kGs | Intrinsic coercive force/ kOe | Maximum magnetic energy product/ MGOe |
|---|---|---|---|
| Conventional method | 13.18 | 19.80 | 41.75 |
| Covering method | 12.97 | 23.38 | 42.30 |

Scheme 6:

A method for preparing NdFeB magnetic powder using a heavy rare earth, comprising the specific steps as follows:

Step 1: preparing NdFeB magnetic powder of 1 μm-2 mm;

After smelting and casting, the NdFeB magnet is mechanically crushed, or hydrogen crushed, or crushed in an air jet mill to prepare NdFeB magnetic powder.

Step 2: selecting a desired heavy rare earth target material; placing the NdFeB magnetic powder and the heavy rare earth target material in a physical vapor deposition device, respectively;

The heavy rare earth target material is at least one selected from the group of pure metal, alloy or oxide of Dy, Tb or Dy-Tb.

Step 3: evacuating the chamber to a degree of vacuum lower than $2.0 \times 10^{-2}$ Pa, charging argon to 0.2-1.0 Pa;

Step 4: adjusting the parameters to uniformly disperse the NdFeB magnetic powder while heating the NdFeB magnetic powder, where the heating temperature is 300-500° C.;

Step 5: turning on the physical vapor deposition device to deposit the heavy rare earth particles onto the dispersed NdFeB magnetic powder by the physical vapor deposition;

The physical vapor deposition includes magnetron sputtering deposition, ion plating deposition, and evaporation source deposition. The heavy rare earth particle deposition rate is 0.01-50 μm/min.

Step 6: terminating the physical vapor deposition, and taking out the NdFeB magnetic powder after its temperature decreases to room temperature.

Example 20

(1) Ingredients-mixing, smelting, strip casting, disc crushing and ball milling were performed, so as to obtain NdFeB magnetic powder with an average particle size of 3.5 μm;

(2) Physical vapor deposition was carried out to cover the obtained magnetic powder.

Dy metal target material was selected, the chamber was evacuated to a vacuum degree of $2.0 \times 10^{-2}$ Pa, argon was charged to 0.2 Pa; the magnetic powder was heated to 380° C.; magnetron sputtering was carried out with the sputtering power adjusted to get Dy particle deposition rate of 0.01 μm/min, and the covered NdFeB magnetic powder was taken out after its temperature decreases to room temperature.

(3) Orientation molding, sintering and heat treatment were performed on the obtained magnetic powder, so as to obtain a final NdFeB magnet.

The magnetic energy product and the coercive force of the magnet prepared in this example were tested with a magnetic property measuring instruments, and compared with the magnet prepared by the conventional method. The results are shown in Table 20.

TABLE 20

| Samples | Remanence/ kGs | Intrinsic coercive force/ kOe | Maximum magnetic energy product/ MGOe |
|---|---|---|---|
| NdFeB | 12.62 | 18.39 | 37.51 |
| NdFeB—Dy | 12.55 | 22.83 | 37.80 |

Example 21

(1) Ingredients-mixing, smelting, strip casting, hydrogen crushing and jet milling were performed, so as to obtain NdFeB magnetic powder with an average particle size of 4.1 μm;

(2) Physical vapor deposition was carried out to cover the obtained magnetic powder.

Tb metal target material was selected, the chamber was evacuated to a vacuum degree of $5.0 \times 10^{-3}$ Pa, argon was charged to 0.5 Pa; the magnetic powder was heated to 420° C., ion plating (the atoms from the target are mostly in an ion state with a higher energy, leading to a better combination with the surface of the NdFeB magnetic powder) was performed. The current of the argon source was adjusted so that the deposition rate of the Tb particles was 50 μm/min, and the covered NdFeB magnetic powder was taken out after its temperature decreases to room temperature.

(3) Orientation molding, sintering and heat treatment were performed on the obtained magnetic powder, so as to obtain a final NdFeB magnet.

The magnetic energy product and the coercive force of the magnet prepared in this example were tested with a magnetic property measuring instruments, and compared with the magnet prepared by the conventional method. The results are shown in Table 21.

TABLE 21

| Samples | Remanence/ kGs | Intrinsic coercive force/ kOe | Maximum magnetic energy product/ MGOe |
|---|---|---|---|
| NdFeB | 13.48 | 19.36 | 42.97 |
| NdFeB—Tb | 13.13 | 28.45 | 41.62 |

Example 22

(1) Ingredients-mixing, smelting, strip casting, hydrogen crushing were performed, so as to obtain NdFeB magnetic powder;

(2) Physical vapor deposition was carried out to cover the obtained magnetic powder;

DyTb metal target material was selected, the chamber was evacuated to a vacuum degree of $9.0 \times 10^{-4}$ Pa, the magnetic powder was heated to 300° C., the vapor deposition was carried out with the heating source power of the evaporation boat adjusted to get DyTb atoms vaporized and evaporated at a deposition rate of 3 μm/min, and the covered NdFeB magnetic powder was taken out after its temperature decreases to room temperature.

(3) Jet milling was performed on the obtained magnetic powder, so as to prepare NdFeB magnetic powder with an average particle size of 3.7 μm;

(4) Orientation molding, sintering and heat treatment were performed on the prepared NdFeB magnetic powder, so as to obtain a final NdFeB magnet.

The magnetic energy product and the coercive force of the magnet prepared in this example were tested with a magnetic property measuring instruments, and compared with the magnet prepared by the conventional method. The results are shown in Table 22.

TABLE 22

| Samples | Remanence/ kGs | Intrinsic coercive force/ kOe | Maximum magnetic energy product/ MGOe |
|---|---|---|---|
| NdFeB | 13.18 | 19.80 | 41.75 |
| NdFeB—DyTb | 12.97 | 26.38 | 40.70 |

Example 23

(1) Ingredients-mixing, smelting, strip casting, hydrogen crushing and jet milling were performed, so as to obtain magnetic powder of NdFeB alloy with an average particle size of 4.3 μm;

(2) Physical vapor deposition was carried out to cover the obtained magnetic powder;

$Dy_2O_3$ target material was selected, the chamber was evacuated to a vacuum degree of $3.0 \times 10^{-2}$ Pa, argon was charged to 0.3 Pa, the magnetic powder was heated to 500° C., magnetron sputtering was performed with the sputtering power adjusted to get $Dy_2O_3$ particle deposition rate of 0.2 μm/min, and the covered NdFeB magnetic powder was taken out after its temperature decreases to room temperature.

(3) Orientation molding, sintering and heat treatment were performed on the magnetic powder obtained in the step (2), so as to obtain a final NdFeB magnet.

The magnetic energy product and the coercive force of the magnet prepared in this example were tested with a magnetic property measuring instruments, and compared with the magnet prepared by the conventional method. The results are shown in Table 23.

TABLE 23

| Samples | Remanence/ kGs | Intrinsic coercive force/ kOe | Maximum magnetic energy product/ MGOe |
|---|---|---|---|
| NdFeB | 13.32 | 19.43 | 42.13 |
| NdFeB—$Dy_2O_3$ | 13.18 | 23.59 | 41.65 |

Scheme 7:

A method for preparing an NdFeB magnet with a low amount of heavy rare earth but high coercive force, comprising the specific steps as follows:

Step 1: mixing the ingredients according to the formula, smelting and strip casting the mixture;

Step 2: hydrogen crushing, disproportionation reaction, and jet milling are carried out on NdFeB cast sheets to obtain NdFeB fine powder, which has an average particle diameter $D_{50}$ of 300 nm-20 μm;

Step 3: heavy rare earth element particles and high-melting element particles are deposited onto the NdFeB fine powder by thermal resistance evaporation deposition;

The heavy rare earth element particles are particles of elements Dy or Tb, and the high-melting element particles are particles of elements W, Mo, V, Ti, Ta, Zr, Nb, Co, Cr or Ga.

In the thermal resistance evaporation deposition process, the NdFeB fine powder and the heavy rare earth thermal resistance wire are respectively placed in the thermal resistance evaporation deposition device, and the vacuum degree of thermal resistance evaporation is $10^5$ Pa-$10^2$ Pa; adjusting the parameters so as to uniformly disperse the NdFeB fine powder; evaporating the heavy rare earth element particles by heating the heavy rare earth thermal resistance wire, so that the heavy rare earth element particles may be deposited on the NdFeB fine powder; taking out the NdFeB fine powder after its temperature decreased to room temperature. For the heavy rare earth thermal resistance wire, the heavy rare earth element is pure metal or alloy of at least one element selected from Dy or Tb.

In the thermal resistance evaporation deposition process, the NdFeB fine powder and the high-melting thermal resistance wire are placed in the thermal resistance evaporation deposition device, and the vacuum degree of thermal resistance evaporation is $10^5$ Pa-$10^2$ Pa; adjusting the parameters so as to uniformly disperse the NdFeB fine powder; evaporating the high-melting element particles by heating the high-melting thermal resistance wire, so that the high-melting element particles may be deposited on the NdFeB fine powder; taking out the NdFeB fine powder after its temperature decreased to room temperature. The high-melting thermal resistance wire is pure metal or alloy of at least one element selected from elements W, Mo, V, Ti, Ta, Zr, Nb, Co, Cr or Ga.

Step 4: performing orientation compression molding, sintering in vacuum and heat treatment on the obtained NdFeB fine powder, so as to obtain a final NdFeB magnet.

Example 24

(1) Ingredients-mixing, smelting, strip casting were performed, so as to obtain NdFeB cast sheet;

(2) Hydrogen crushing, disproportionation reaction, and jet milling were carried out to obtain NdFeB fine powder with an average particle diameter $D_{50}$ of 400 nm;

(3) The NdFeB fine powder and the Dy thermal resistance wire were respectively placed in the thermal resistance evaporation deposition device; the vacuum degree was $10^3$ Pa; the parameters were set so as to uniformly disperse the NdFeB fine powder; the thermal resistance wire was heated to evaporate and deposit the Dy particles on the NdFeB fine powder; the NdFeB fine powder was taken out after its temperature decreased to room temperature.

(4) Orientation molding, sintering and heat treatment were performed on the obtained NdFeB fine powder, so as to obtain a final NdFeB magnet. The magnetic energy product and the coercive force of the magnet prepared in this example were tested with a magnetic property measuring instruments, and compared with the magnet prepared by the conventional method. The results are shown in Table 24.

TABLE 24

| Samples | Remanence/ kGs | Intrinsic coercive force/ kOe | Maximum magnetic energy product/ MGOe |
|---|---|---|---|
| NdFeB | 12.62 | 18.39 | 37.51 |
| NdFeB—Dy | 12.55 | 22.83 | increased |

Example 25

(1) Ingredients-mixing, smelting, strip casting were performed, so as to obtain NdFeB cast sheet;

(2) Hydrogen crushing, disproportionation reaction, and jet milling were carried out to obtain NdFeB fine powder with an average particle diameter $D_{50}$ of 800 nm;

(3) The NdFeB fine powder and the Tb thermal resistance wire were respectively placed in the thermal resistance evaporation deposition device; the vacuum degree was $10^3$ Pa; the parameters were set so as to uniformly disperse the NdFeB fine powder; the thermal resistance wire was heated to evaporate and deposit the Tb particles on the NdFeB fine powder; the NdFeB fine powder was taken out after its temperature decreased to room temperature.

(4) Orientation molding, sintering and heat treatment were performed on the obtained NdFeB fine powder, so as to obtain a final NdFeB magnet. The magnetic energy product and the coercive force of the magnet prepared in this example were tested with a magnetic property measuring instruments, and compared with the magnet prepared by the conventional method. The results are shown in Table 25.

TABLE 25

| Samples | Remanence/kGs | Intrinsic coercive force/kOe | Maximum magnetic energy product/MGOe |
|---|---|---|---|
| NdFeB | 13.48 | 19.36 | 42.97 |
| NdFeB—Tb | 13.13 | 28.45 | increased |

Example 26

(1) Ingredients-mixing, smelting, strip casting were performed, so as to obtain NdFeB cast sheet;

(2) Hydrogen crushing, disproportionation reaction, and jet milling were carried out to obtain NdFeB fine powder with an average particle diameter $D_{50}$ of 1 μm;

(3) The NdFeB fine powder and the CoZr thermal resistance wire were respectively placed in the thermal resistance evaporation deposition device; the vacuum degree was $10^3$ Pa; the parameters were set so as to uniformly disperse the NdFeB fine powder; the thermal resistance wire was heated to evaporate and deposit the CoZr particles on the NdFeB fine powder; the NdFeB fine powder was taken out after its temperature decreased to room temperature.

(4) Orientation molding, sintering and heat treatment were performed on the obtained NdFeB fine powder, so as to obtain a final NdFeB magnet. The magnetic energy product and the coercive force of the magnet prepared in this example were tested with a magnetic property measuring instruments, and compared with the magnet prepared by the conventional method. The results are shown in Table 26.

TABLE 26

| Samples | Remanence/ kGs | Intrinsic coercive force/ kOe | Maximum magnetic energy product/ MGOe |
| --- | --- | --- | --- |
| NdFeB | 13.18 | 19.80 | 41.75 |
| NdFeB—CoZr | 12.97 | 23.38 | increased |

Scheme 8:

A method for preparing NdFeB fine powder, comprising the specific steps as follows:

Step 1: mixing the ingredients according to the formula, smelting and strip casting the mixture;

Step 2: hydrogen crushing, disproportionation reaction, and jet milling are carried out on NdFeB cast sheets to obtain NdFeB fine powder, which has an average particle diameter $D_{50}$ of 300 nm-20 μm;

Step 3: heavy rare earth element particles and high-melting element particles are deposited onto the NdFeB fine powder by thermal resistance evaporation deposition;

The high-melting particles are particles of elements W, Mo, V, Ti, Ta, Zr, Nb, Co, Cr or Ga; and the heavy rare earth element particles are particles of elements Dy or Tb.

In the thermal resistance evaporation deposition process, the NdFeB fine powder and the heavy rare earth thermal resistance wire are respectively placed in the thermal resistance evaporation deposition device, and the vacuum degree of thermal resistance evaporation is $10^5$ Pa-$10^2$ Pa; adjusting the parameters so as to uniformly disperse the NdFeB fine powder; evaporating the heavy rare earth element particles by heating the heavy rare earth thermal resistance wire, so that the heavy rare earth element particles may be deposited on the NdFeB fine powder; taking out the NdFeB fine powder after its temperature decreased to room temperature. For the heavy rare earth thermal resistance wire, the heavy rare earth element is pure metal or alloy of at least one element selected from Dy or Tb.

In the thermal resistance evaporation deposition process, the NdFeB fine powder and the high-melting thermal resistance wire are respectively placed in the thermal resistance evaporation deposition device, and the vacuum degree of thermal resistance evaporation is $10^5$ Pa-$10^2$ Pa; adjusting the parameters so as to uniformly disperse the NdFeB fine powder; evaporating the high-melting particles by heating the high-melting thermal resistance wire, so that the high-melting element particles may be deposited on the NdFeB fine powder; taking out the NdFeB fine powder after its temperature decreased to room temperature. The high-melting thermal resistance wire is pure metal or alloy of at least one element selected from element W, Mo, V, Ti, Ta, Zr, Nb, Co, Cr or Ga.

Step 4: taking out the NdFeB fine powder after its temperature decreased to room temperature.

Example 27

(1) Ingredients-mixing, smelting, strip casting, hydrogen crushing, disproportionation reaction, and jet milling were carried out to obtain NdFeB fine powder with an average particle diameter $D_{50}$ of 400 nm;

(2) The NdFeB fine powder and the DyTb thermal resistance wire were respectively placed in the thermal resistance evaporation deposition device; the vacuum degree was $10^3$ Pa; the parameters were set so as to uniformly disperse the NdFeB fine powder; the thermal resistance wire was heated to evaporate and deposit the Dy or Tb particles on the NdFeB fine powder; the covered NdFeB fine powder was taken out after its temperature decreased to room temperature.

(3) Orientation molding, sintering and heat treatment were performed on the obtained NdFeB fine powder, so as to obtain a final NdFeB magnet. The magnetic energy product and the coercive force of the magnet prepared in this example were tested with a magnetic property measuring instruments, and compared with the magnet prepared by the conventional method. The results are shown in Table 27.

TABLE 27

| Samples | Remanence/ kGs | Intrinsic coercive force/ kOe | Maximum magnetic energy product/ MGOe |
| --- | --- | --- | --- |
| Conventional method | 12.62 | 18.39 | 37.51 |
| Covering method | 12.55 | 22.83 | increased |

Example 28

(1) Ingredients-mixing, smelting, strip casting, hydrogen crushing, disproportionation reaction, and jet milling were carried out to obtain NdFeB fine powder with an average particle diameter $D_{50}$ of 800 nm;

(2) The NdFeB fine powder and the Tb thermal resistance wire were respectively placed in the thermal resistance evaporation deposition device; the vacuum degree was $10^3$ Pa; the parameters were set so as to uniformly disperse the NdFeB fine powder; the thermal resistance wire was heated to evaporate and deposit the Tb particles on the NdFeB fine powder; the covered NdFeB fine powder was taken out after its temperature decreased to room temperature.

(3) Orientation molding, sintering and heat treatment were performed on the obtained NdFeB fine powder, so as to obtain a final NdFeB magnet. The magnetic energy product and the coercive force of the magnet prepared in this example were tested with a magnetic property measuring instruments, and compared with the magnet prepared with the same addition amount of Tb by the conventional method. The results are shown in Table 28.

TABLE 28

| Samples | Remanence/ kGs | Intrinsic coercive force/ kOe | Maximum magnetic energy product/ MGOe |
|---|---|---|---|
| Conventional method | 13.48 | 19.36 | 42.97 |
| Covering method | 13.13 | 28.45 | increased |

Example 29

(1) Ingredients-mixing, smelting, strip casting, hydrogen crushing, disproportionation reaction, and jet milling were carried out to obtain NdFeB fine powder with an average particle diameter $D_{50}$ of 1 μm;

(2) The NdFeB fine powder and the CoZr thermal resistance wire were respectively placed in the thermal resistance evaporation deposition device; the vacuum degree was $10^3$ Pa; the parameters were set so as to uniformly disperse the NdFeB fine powder; the thermal resistance wire was heated to evaporate and deposit the CoZr particles on the NdFeB fine powder; the covered NdFeB fine powder was taken out after its temperature decreased to room temperature.

(3) Orientation molding, sintering and heat treatment were performed on the obtained NdFeB fine powder, so as to obtain a final NdFeB magnet. The magnetic energy product and the coercive force of the magnet prepared in this example were tested with a magnetic property measuring instruments, and compared with the magnet prepared with the same addition amount of CoZr by the conventional method. The results are shown in Table 29.

TABLE 29

| Samples | Remanence/ kGs | Intrinsic coercive force/ kOe | Maximum magnetic energy product/ MGOe |
|---|---|---|---|
| Conventional method | 13.18 | 19.80 | 41.75 |
| Covering method | 12.97 | 23.38 | increased |

The terms used in this disclosure are illustrative and exemplary, thus should not be construed as limitation. The present invention may be implemented in a variety of forms without departing from the spirit or scope of the invention. Thus, it should be understood that the above examples are not limited to the aforementioned details, but should be generally explained in the spirit and scope defined by the accompanied claims. Therefore, all changes and modifications that fall within the scope of the claims or the equivalents thereof are intended to be covered by the appended claims.

INDUSTRIAL APPLICABILITY

The heavy rare earth particles or the high-melting particles are uniformly dispersed at the grain boundaries in the magnet, that increases the coercive force of the magnet, refines the crystal grains of the magnet, and reduces the usage amount of heavy rare earth; the coercive force of the NdFeB magnet is significantly increased, the amount of heavy rare earth element is greatly reduced, the manufacturing cost of the NdFeB magnet is decreased, and the oxygen content in the magnet is reduced.

What is claimed is:

1. A method for preparing a NdFeB permanent magnetic material, the method comprising:
   (1) carrying out ingredients-mixing, smelting, strip casting, hydrogen crushing, disproportionation reaction, and jet milling to obtain NdFeB fine powder with an average particle diameter D50 of 1 μm;
   (2) placing the NdFeB fine powder and a CoZr thermal resistance wire respectively in a thermal resistance evaporation deposition device with a vacuum degree of $10^3$ Pa; setting parameters so as to uniformly disperse the NdFeB fine powder; heating the CoZr thermal resistance wire to evaporate and deposit CoZr particles on the NdFeB fine powder; taking out the covered NdFeB fine powder after its temperature is decreased to room temperature;
   (3) performing orientation molding, sintering, and heat treatment on the covered NdFeB fine powder so as to obtain the NdFeB permanent magnetic material.

* * * * *